(12) United States Patent
Zhou et al.

(10) Patent No.: US 12,710,319 B2
(45) Date of Patent: Aug. 18, 2026

(54) SELF HEATING EXTRACTION DESIGN AND METHODOLOGY WITH POWER CONSUMPTION CORRECTION

(71) Applicant: International Business Machines Corporation, Armonk, NY (US)

(72) Inventors: Huimei Zhou, Albany, NY (US); Miaomiao Wang, Albany, NY (US); Effendi Leobandung, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 581 days.

(21) Appl. No.: 17/848,616

(22) Filed: Jun. 24, 2022

(65) Prior Publication Data

US 2023/0417604 A1 Dec. 28, 2023

(51) Int. Cl.
*G01K 7/00* (2006.01)
*G01R 21/06* (2006.01)

(52) U.S. Cl.
CPC ............... *G01K 7/00* (2013.01); *G01R 21/06* (2013.01)

(58) Field of Classification Search
CPC .. G01K 7/00; G01K 7/20; G01K 7/24; G01K 7/425; G01K 7/015; G01R 21/06; G01R 31/2628
See application file for complete search history.

(56) References Cited

U.S. PATENT DOCUMENTS 5,872,952 A * 2/1999 Tuan .................. G01R 31/2848 257/E23.079
7,798,703 B2 9/2010 Vollertsen
(Continued)

FOREIGN PATENT DOCUMENTS

CN 112630613 A 4/2021
JP 2020191420 A 11/2020

OTHER PUBLICATIONS

Niu, H., & Lorenz, R. D. , "Sensing Power MOSFET Junction Temperature Using Gate Drive Turn-On Current Transient Properties", IEEE Transactions on Industry Applications, Nov. 2015, pp. 1677-1687, 52(2).

(Continued)

*Primary Examiner* — Lee E Rodak
*Assistant Examiner* — Zannatul Ferdous
(74) *Attorney, Agent, or Firm* — Scully, Scott, Murphy & Presser, P.C.; Kimberly S. Zillig

(57) ABSTRACT

A semiconductor device structure and methodology for determining a power consumption of the device structure and to extract accurate real temperatures due to self-heating effects. The semiconductor device structure includes a first transistor device formed as a heater device and an adjacent device such as a second transistor device or a semiconductor junction device. In the method, the first transistor device is operable at different operating states (e.g., off state or at different applied power levels), and at each state, an electrical characteristic is measured at the adjacent second transistor device or junction device. The electrical characteristic measured at the adjacent second semiconductor device is correlated to a power consumption of the first device while excluding a power consumption due to voltage drops due to resistance of connected metal layers, vias or contacts. Accurate thermal conductivity is thus achievable for better Design Technology Co-Optimization (DTCO) and device/circuit reliability evaluation.

17 Claims, 8 Drawing Sheets

(56) References Cited

U.S. PATENT DOCUMENTS

| | | | | |
|---|---|---|---|---|
| 8,927,909 | B2 | 1/2015 | Le Neel et al. | |
| 9,536,876 | B2 | 1/2017 | Peng et al. | |
| 9,970,981 | B2 | 5/2018 | Feng et al. | |
| 10,247,617 | B2 | 4/2019 | Ge et al. | |
| 2007/0030049 | A1* | 2/2007 | Yoshikawa | G01K 7/01 327/512 |
| 2007/0262359 | A1 | 11/2007 | Hyde et al. | |
| 2012/0250385 | A1* | 10/2012 | Takihara | G01K 7/00 327/131 |
| 2015/0035568 | A1* | 2/2015 | Peng | H01L 23/34 327/109 |
| 2019/0277705 | A1* | 9/2019 | Lee | G01K 7/21 |
| 2022/0178979 | A1* | 6/2022 | Richmond | H10D 62/8325 |

OTHER PUBLICATIONS

Liu, Z., Wu, H., Zhang, C., Miao, X., Zhou, H., Southwick, R., . . . & Guo, D.; "Direct Partition Measurement of Parasitic Resistance Components in Advanced Transistor Architectures", 2019 Symposium on VLSI Technology, Jun. 2019, pp. T146-T147), IEEE.

* cited by examiner

SELF HEATING EXTRACTION DESIGN AND METHODOLOGY WITH POWER CONSUMPTION CORRECTION

BACKGROUND

The present disclosure relates to semiconductor circuit designs, and particularly to modeling temperatures of a self-heating semiconductor device.

Semiconductor transistor device nodes developed at the nanometer level can exhibit self-heating effects.

In order to correctly predict device performance and correctly predict performance of circuits including such devices, it is critical to obtain accurate self heating measurements of such devices.

SUMMARY

A novel self-heating design and self-heating characterization methodology to correct power consumption and to provide for the accurate determining of the temperature of an active region of a device as a function of electrical power through the device.

According to an aspect of the present disclosure, a self heater semiconductor device or semiconductor structure is employed that includes a FinFET, e.g., a nanosheet (NS) FinFET, and a power sensor that more accurately senses an electrical characteristic, e.g., voltage, current or resistance, and further performs improved electrical impedance measuring at various locations and structures at the FinFET device and at an adjacent device.

In embodiments, the power sensor that performs electrical impedance measuring is configured as a four terminal Kelvin sensor, that connects to the FinFET device in a manner that allows the voltage across a device structure whose impedance is to be measured while avoiding voltage drops along the wiring or contact in the current measurement loop.

In an embodiment, the heater structure is a FinFET device with kelvin structure to determine accurate power consumption, and the Kelvin sensor is structured to measure the gate resistance, i.e., resistance across the local gate metal of the heater FinFET itself.

In a further embodiment, the heater structure is a FinFET device with kelvin structure to determine accurate power consumption, and the sensor is located adjacent the heater device and is structured for measuring an electrical characteristic used for determining a thermal impacting a forward bias voltage of a P/N junction diode due to the adjacent heater FET.

In yet another embodiment, the heater structure is a FinFET device with Kelvin structure to determine accurate power consumption, and the sensor device is located adjacent the heater device and is structured for measuring an electrical characteristic used for determining thermal impacting device parameters such as a voltage threshold or subthreshold slope due to the adjacent heater FET.

In a first embodiment, there is provided a semiconductor device. The semiconductor device comprises: a first semiconductor transistor heater device having a drain region, a source region and a gate region formed therebetween, the drain, source and gate regions configured to receive an electrical stimulus to place the first semiconductor transistor device in an on or off state; a second semiconductor device situated adjacent and electrically connected to a drain contact or source region of the first semiconductor transistor heater device; and a sensor operatively connected to the first semiconductor transistor device for measuring an electrical characteristic at the second semiconductor device.

In embodiments, wherein said first semiconductor heater device accommodates a four-terminal Kelvin sensor structure having first and second Kelvin terminals configured to apply voltage at said drain region and said source region, and having third and fourth kelvin terminals configured to measure the electrical characteristic at said drain region and said source region.

In a further embodiment, there is provided a computer-implemented method for determining a semiconductor transistor device characteristics. The method comprises: operatively connecting a sensor device to a first semiconductor transistor heater device and a second semiconductor device situated adjacent the first semiconductor transistor heater device, the first semiconductor transistor heater device having a drain region having a drain contact structure disposed thereon, a source region having a source contact structure disposed thereon, and a gate region formed between the source and drain regions and corresponding source and drain contact structures; and the sensor device being operatively connected to further contacts of the first semiconductor transistor heater device and the second semiconductor device; configuring the sensor device to apply an electrical stimulus to one or more the drain contact, source contact or gate region for placing the first semiconductor transistor heater device in an on or off state; and measuring an electrical characteristic of the second semiconductor device while the first semiconductor transistor heater device is in the on or off state, the electrical characteristic of the second semiconductor device used to correlate temperature to power consumption impact from the first semiconductor transistor heater device.

In the method, the configuring the sensor device to apply an electrical stimulus comprises: altering the electrical stimulus applied to the drain, source and gate contact structures of the first semiconductor transistor device, the altering electrical stimulus achieving a different power level at the first semiconductor transistor device; and measuring an electrical characteristic of the second semiconductor device while the first semiconductor transistor device is in the on or off state.

DETAILED DESCRIPTION

Figures 1, 2:
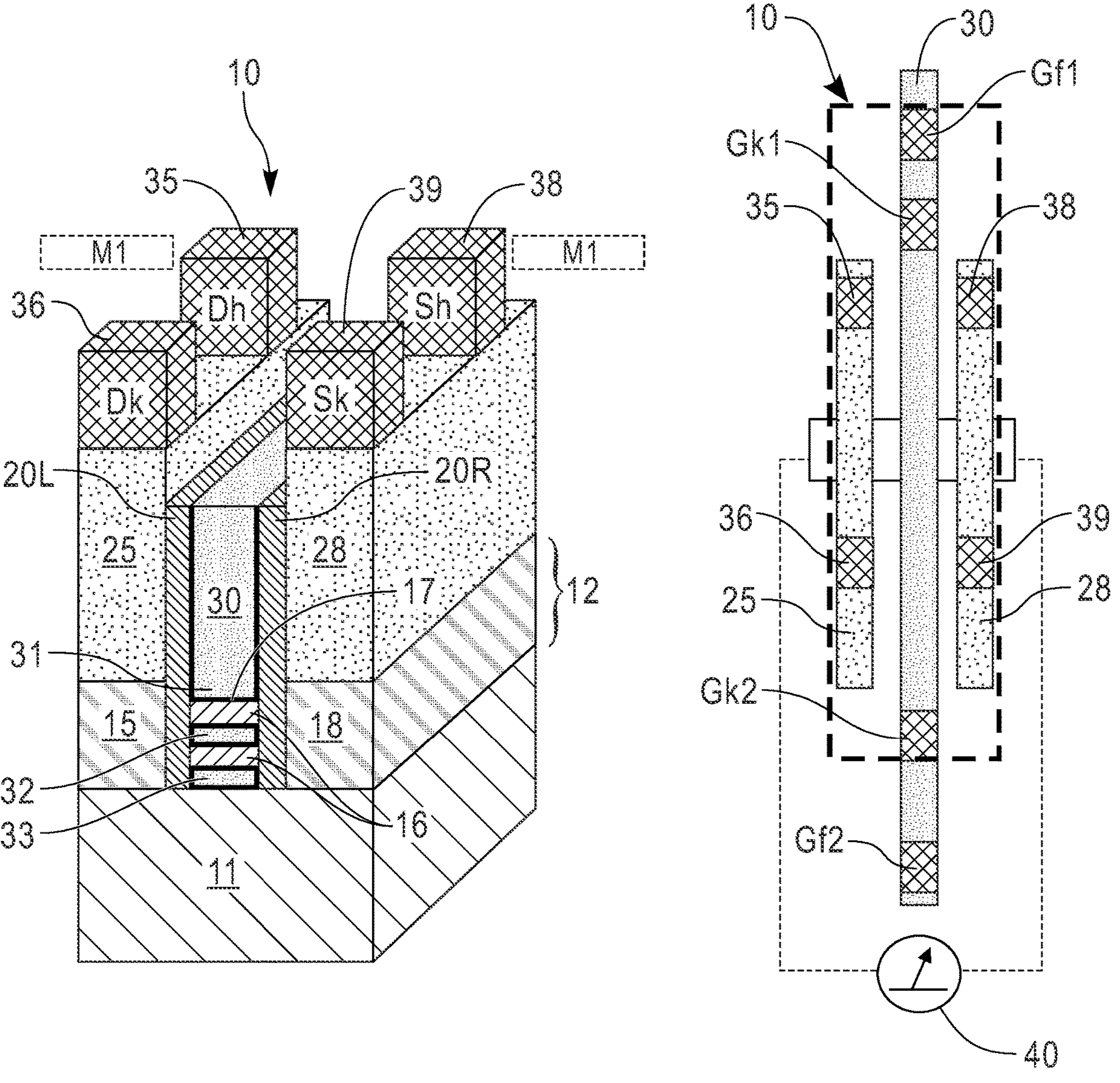
FIG. 1 is a vertical cross-sectional view of an exemplary semiconductor structure including a portion of a “gate-all-around” semiconductor nanosheet FinFET device functioning as a heater device according to an embodiment of the present disclosure.
FIG. 2 shows a top view of a surface of the nanosheet FINFET heater device of the embodiment of the present disclosure shown in FIG. 1.

As field effect transistor (FET) devices, e.g., metal-oxide FETs (MOSFETs) and related devices, e.g., FinFETS, nanosheet FinFETs (NS Fets), semiconductor junctions, etc. scale down in size, temperature and self-heating effects increase. For example, the power consumption at device metal wiring and device contacts occupy a greater percentage and the increased power consumption can result in non-linear temperature versus power extraction measurements. The present disclosure relates to semiconductor circuit designs, and particularly to modeling temperatures of a self-heating semiconductor device. Aspects of the present disclosure are now described in detail with accompanying figures. It is noted that like reference numerals refer to like elements across different embodiments. The drawings are not necessarily drawn to scale.

To achieve accurate thermal conductivity for better design technology co-optimization (DTCO) and device/circuit reliability evaluation, it is important to extract accurate real temperature measurements while the device/circuit operates. The modeling of the temperature of an active region of a semiconductor MOSFET device ("device") as a function of electrical power through the device provides information that can be used to characterize the effect of temperature on the performance characteristics of the device (and thereby more accurately model and determine the effects on performance of the heater device). This information may be utilized by design engineers to predict device performance during the circuit layout process, as a function of temperature, and to accommodate such temperature effects in the circuit design.

In a first embodiment, to reliably measure the temperature and hence, more accurately model self-heating and power consumption of a semiconductor MOSFET device ("heater device" or "heater MOSFET device"), a first method includes operatively connecting a sensor device, e.g., a Kelvin sensor for providing an electrical stimulus, to terminal connections upon drain and source contacts of a heater MOSFET device itself, e.g., a FinFET, a Planar FET device or a nanosheet (NS) FinFET device. In particular, when connected to other terminals, a fourterminal (Kelvin) sensor can more accurately measure a temperature and self-heating effects of the device. In such an embodiment, the self-heating effects of the heater device can be obtained while in a powered "on" state compared with an "off" state. In an embodiment, a drain contact structure (Dh) and source contact structure (Sh) of the heater device can be driven by receiving an electrical stimulus, e.g., a driving voltage or current, and the same source and drain contact structures additionally includes respective contact connections (Dk), (Sk) to other terminals of a Kelvin sensor measurement device for obtaining a device characteristic measurement, e.g., a voltage or current or resistance (impedance) measurement used for extracting a power consumption value or temperature value characterizing the self-heating effects across the (heater) transistor gate. In this embodiment, a metal/contact resistance drop is excluded from the Kelvin sensor measurement and thus, the method obtains more accurate temperature information when stressed and hence a more accurate power consumption measurement across the device channel. That is, this configuration and method for power consumption measurement obtains more accurate information of the device self-heating by the excluding a power consumption component due to voltage drops due to contact resistances, i.e., at the via and at any metal conductor, e.g., a M1 metal level conductor, that may connect to a FET device metal contact structure.

In a second embodiment, to reliably measure the temperature and hence, power consumption of a semiconductor heater device, and thereby determine the effects on performance of the heater device, a second method includes operatively connecting a sensor device, e.g., a Kelvin sensor, upon different drain and source contacts of a FinFET, a planar FET or a NS MOSFET (heater) transistor device. In such an embodiment, a source contact structure associated with a first fin of the heater device can include a source heater via structure (Sh) configured to receive an electrical stimulus and an adjacent contact structure associated with a second fin of the heater device and connected by nanosheet channel connections through a dummy gate includes a source sensor via structure (EV2) for connection to a Kelvin voltage or current sensor terminal used in obtaining a resistance/power measurement across the first gate fin. Likewise, in this embodiment, a drain contact structure associated with the first fin of the heater device can include a drain heater via structure (Dh) configured for receiving an electrical stimulus and an adjacent drain contact associated with a third fin of the heater device and connected by further nanosheet channel connections through a further dummy gate includes a drain Kelvin sensor via connection structure (EV1) for connection to the voltage or current sensor used in obtaining the resistance/power measurement across the first gate fin and more accurate temperature information when stressed. The configuration and method for power consumption measurement in this embodiment is more accurate by excluding of the power consumption component due to the metal/contact resistance voltage drops. That is, in this embodiment, a metal/contact resistance voltage drop is excluded from the Kelvin sensor measurement and thus the method obtains more accurate temperature (self-heating) information when stressed and is used to more accurately model device performance.

In a third embodiment, to reliably measure the temperature and hence power consumption of a semiconductor device, and thereby more accurately determine the self-heating effects on performance of the device, a third method includes operatively connecting a sensor device, e.g., Kelvin sensor terminals, upon drain and source contact terminals of a first heater transistor FET (e.g., planar MOSFET, a Fin- FET, a NS FinFET) and connecting further Kelvin sensor terminals upon one or more drain and source contacts at an adjacent sensor MOSFET device, e.g., a sensor NS FinFET located adjacent the heater FinFET device for thermal to electrical correlation from electrical test by obtaining the resistance/power measurement of the adjacent sensor MOSFET when the heater device is placed in off or various "on" powered states. The configuration and method for power consumption measurement in this embodiment is more accurate by excluding of the power consumption at the metal/contact resistance drop. That is, in this embodiment, a metal/contact resistance drop is excluded from the Kelvin sensor measurement and thus the method obtains more accurate temperature (self-heating) information when stressed and is used to more accurately model device performance.

In a fourth embodiment, the Kelvin sensor heater contacts are operatively connected to the drain terminal and source terminal of the heater transistor device and Kelvin sensor measurement contacts are connected to obtain electrical characteristic measurement at a semiconductor junction located adjacent the heater MOSFET device for thermal to electrical correlation from electrical test.

In accordance with the first embodiment, FIG. 1 shows a cross section view of a portion of a "gate-all-around" semiconductor nanosheet (NS) FinFET device, e.g., a nanosheet FINFET 10 for below 10 nm nodes, functioning as a heater device. The nanosheet FINFET 10 includes, as shown vertically from bottom up, a semiconductor substrate 11, and an epitaxially grown semiconductor material layer 12 formed on substrate 11 that includes a drain region 15 and source region 18. Formed on top of epitaxial grown drain region 15 is a corresponding vertically aligned metal or metal alloy drain contact structure 25 and similarly formed on top of epitaxial grown source region 18 is a corresponding vertically aligned metal or metal alloy source contact structure 28.

Formed within semiconductor material layer 12 and suspended between drain region 15 and source region 18 are one or more epitaxially grown vertically stacked horizontal nanosheet channel structures 16. Further, formed between sidewall surfaces of the drain region/contact and the source region/contact and extending vertically from a surface of the substrate is a metal gate structure 30 through which the vertically stacked nanosheet channel structures 16 extend. As known, a nanosheet is formed of a thin layer of semiconductor channel material having a vertical thickness that is typically less than a lateral width of the material. In an embodiment, the metal gate structure 30 includes one or more gate material portions 31, 32, 33 that physically surround each vertically stacked nanosheet channel structure 16 suspended within the device 10. Each exposed portion of the embedded vertically stacked nanosheet channel structure 16 extending through the gate 30 is surrounded by a thin high-K gate oxide layer 17.

Further formed adjacent epitaxially grown drain region 15 and corresponding vertically aligned drain contact structure 25 and separating the remaining physically exposed non-channel regions of the drain region and contact structure regions from the gate structure 30 is a formed first inner dielectric spacer 20L that extends from a surface of the substrate 11 at a length commensurate with the length of the gate structure 30. Additionally, formed adjacent epitaxially grown source region 18 and corresponding source contact 28 and separating the remaining physically exposed non-channel regions of the source region and contact structure regions from the gate structure 30 is a formed second inner dielectric spacer 20R. The first inner spacer 20L and second inner spacer 20R is composed of a dielectric material such as, for example, silicon dioxide or silicon nitride. Between formed inner dielectric spacers 20L, 20R the gate structure 30 may include a gate oxide insulate material SiO2, $Al_2O_3$, $HfO_2$ etc. and metal such as a work function metal (WFM), e.g., TiN.

Fabricated within epitaxial layer 12 of FINFet structure 10 of FIG. 1 and embedded within the gate material of gate structure 30 are one or more horizontal vertically stacked semiconductor nanosheet channel layers 16, each embedded horizontal semiconductor nanosheet channel layer 16 suspended within the epitaxial layer 12 between drain region 15 and source region 18 and having respective ends contacting respective drain region 15 on one end and source region 18 on the other end. The one or more semiconductor nanosheet channel layers 16 are fabricated using selective etching processes including removal of epitaxial layers above and below each layer 16 while not etching remaining portions of device channel within epitaxial layer 12. In an embodiment, the horizontal device sheet 16 is an epitaxial-grown layer—e.g., Si, sandwiched by epitaxial layers of different compositions, e.g., SiGe/Si/SiGe/Si/SiGe.

Surrounding and directly contacting each physically exposed portion of a semiconductor nanosheet channel layer 16 portion extending through the gate structure 30 is a gate dielectric material layer (not shown).

As further shown in FIG. 1, formed on top of drain contact structure 25 is a first drain metal contact via structure 35 and likewise, formed on top of source contact structure 28 is a first source metal contact via structure 38 for connection to a Kelvin sensor device. Additionally, formed separated apart from the first drain contact metal via structure 35 is a second drain metal contact via structure 36 formed on top of drain metal contact structure 25 and likewise, formed separated apart from the first source metal contact via structure 38 is a second source metal contact via structure 39 formed on top of source contact structure 28 for connection to a Kelvin sensor device. In an embodiment, first drain and first source metal via contacts 35, 38 and second drain and second source metal via contacts 36, 39 are connected to form a four-wire (Kelvin) connection to device 10. Standard semiconductor manufacturing techniques could be used for Kelvin sensor building (e.g., etching+metal film deposition+Chemical-Mechanical Planarizing,) and contact via formation. In this configuration, the Kelvin sensor connection using metal contacts 35, 38 and 36, 39 allows a voltage placed across the device to be measured by avoiding voltage drops along the wiring in the current measurement loop.

In the embodiment of FIG. 1, FET 10 is a heater FET, and first drain metal contact via structure 35 functions as a drain contact (Dh) of a "heating" device for sourcing/sinking electric current driven and first source metal contact via structure 38 functions as a source contact (Sh) of the heating device for sinking/sourcing current driven and thereby cause a heating of the device 10.

In an embodiment, the second drain contact via structure 36 functions as a "Kelvin" contact (DK), which is part of the Kelvin sensor measurement loop for measuring an electrical characteristic, e.g., current or voltage or resistance across gate 30, i.e., across the nanosheet channels between drain and source regions, and similarly, second source contact via structure 39 functions as a further Kelvin contact (SK) to the measurement device which is connected to a measurement device, e.g., a sensor (not shown) for completing the measurement circuit that measures the electrical characteristic, e.g., current or voltage or resistance across the gate 30, i.e., across the nanosheet channels 16 between drain and source regions. By placement of the Kelvin sensor at each of the drain and source contact vias, a resistance value of the device channel may be measured by measuring the change in voltage between Sk and Dk connections concurrent with application of a current stimulus driving Dh and Sh terminals of the FET 10. For example, providing a stimulus at Sh contact via of 0 volts (or ground) and a stimulus at Dh contact via of 1 V, and by taking a direct measurement V1 at Kelvin sensor terminal Sk at source contact 28 and a direct measurement V2 at Kelvin sensor terminal Dk at drain contact 25, then a total resistance "R" across a heater FET channel is computed as:

$$R=(V2-V1)/\text{current}$$

which excludes any contact resistance measurement or voltage drops at the via contact or voltage drop due to any metal conductor, e.g., any M1 metal level conductor (shown in broken lines or out of broken lines to measurement pad) that may be connected to the drain or source contacts 25, 28. In such an embodiment, a power "P" consumed due to self-heating effects at device 10 can be computed according to $$P=\Delta V*I$$

where ΔV is the V2−V1 measurement and I is the electrical current measured through device structures between the drain and source contacts 25, 28. Given the example stimulus of 1 Volt at Dh and 0 Volts at Sh, the ΔV<1. In the embodiments, any device characteristic measurement performed excludes a power consumption at the via and at any metal conductor, e.g., a M1 metal level conductor, that may connect to a FET metal contact.

FIG. 2 shows a top view of a surface of the nanosheet FINFET device 10 of the embodiment shown in FIG. 1. Illustrated in FIG. 2 is the FET device layout including gate contact 30, drain contact 25 and source contact 28, and the location of respective heating device drain Dh and Source Sh contacts formed on respective drain and source contacts 25, 28 for connection to a power source for driving the device 10, and the location of the Kelvin sensor device drain Dk and Source Sk contacts formed on respective drain and source contacts 25, 28 for connection to a sensor 40 for measuring gate resistance, while heater is on or off. FIG. 2 additionally depicts a traditional gate resistance self-heating structure that includes four terminal connection Kelvin sensor measurement configuration at the metal gate structure 30 having Gf1, Gf2 and GK1 and GK2 terminal connections for direct connection to a four-terminal Kelvin sensor apparatus, with Gf1, Gf2 terminal connections connecting to a "gate force" or "heater" device (not shown) for driving a voltage or current stimulus at the gate 30 and by directly measuring an electrical characteristic, i.e., gate resistance, at the gate electrode as measured by a measurement device (not shown) connected at GK1 and GK2 sensor terminal connections.

Figure 3:
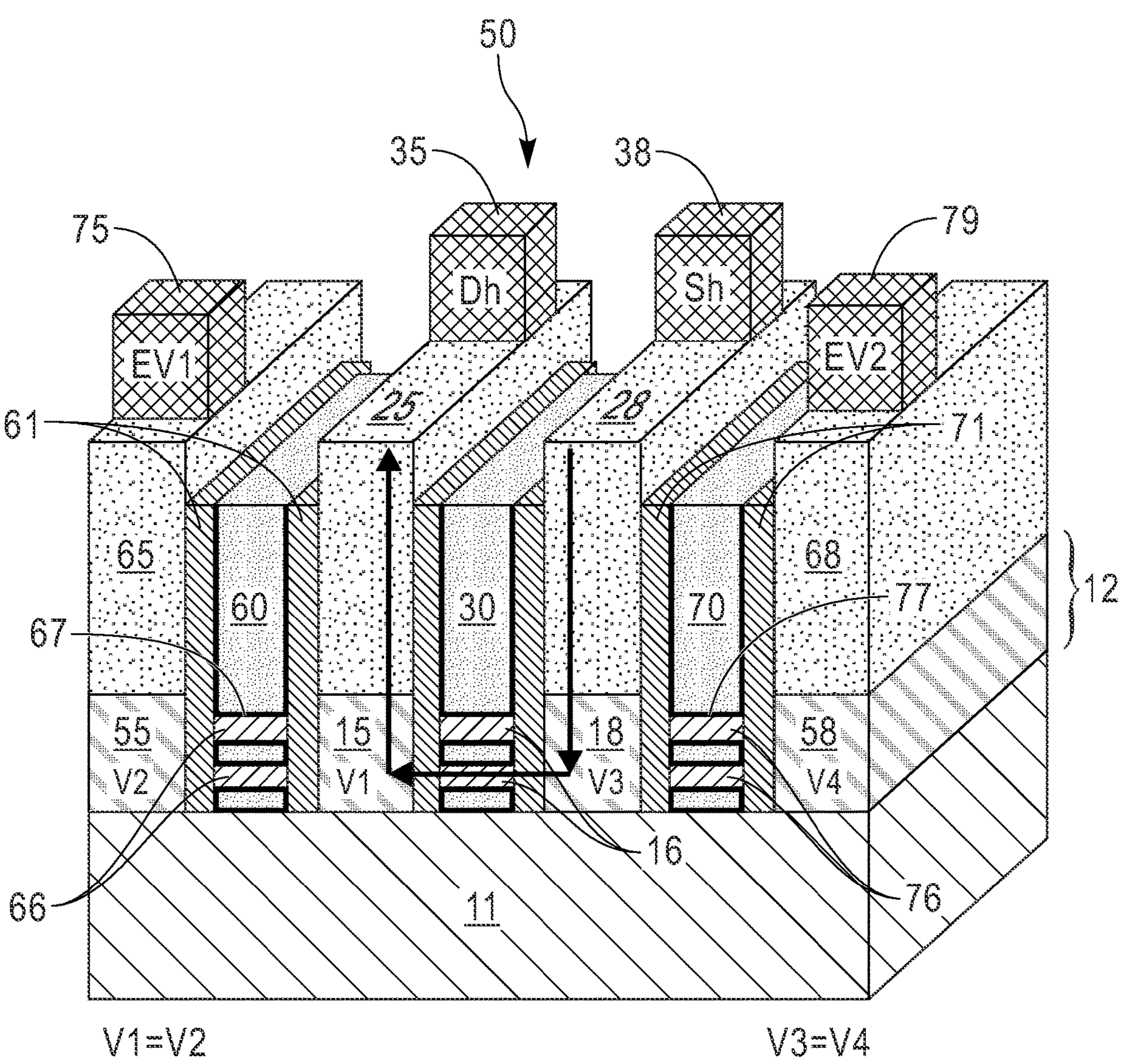
FIG. 3 shows a cross section view of a portion of a further exemplary “gate-all-around” semiconductor NS FinFET device functioning as a heater device according to a further embodiment of the present disclosure.

In accordance with the second embodiment, FIG. 3 shows a cross section view of a portion of a further "gate-all-around" semiconductor NS FinFET device, e.g., a nanosheet FINFET 50, including, as shown vertically from bottom up, a semiconductor substrate 11, and an epitaxially grown semiconductor material layer 12 formed on substrate 11 that includes heater device drain region 15 and heater device source region 18 and their respective vertically aligned metal contact structures 25, 28, the embedded spacers 20L, 20R and gate structure 30 and the one or more horizontal vertically stacked semiconductor nanosheet channel layers 16 as in the embodiment of FIG. 1. However, the embodiment of device 50 of FIG. 3 further includes further adjacent structures including additional drain region 55 and respective vertically aligned drain contact electrode 65 separated from the heater device drain region/contact 15/25 by a further "dummy" gate structure 60 sandwiched between two dielectric spacer structures 61. It is a dummy gate structure as no voltage is applied to this gate. The drain regions 15 and 55 are electrically connected by further embedded one or more horizontal vertically stacked semiconductor nanosheet channel layers 66 that are suspended between and connect drain regions 15 and 55 and with each layer 66 surrounded by a high-K dielectric material layer. Likewise, the embodiment of device 50 of FIG. 3 further includes an adjacent structure including additional source region 58 and respective vertically aligned source contact electrode 68 separated from the heater device source region/contact 18/28 by a further dummy gate structure 70 sandwiched between two dielectric spacer structures 71. The source regions 18 and 58 are electrically connected by further embedded one or more horizontal vertically stacked semiconductor nanosheet channel layers 76 that are suspended between and connect source regions 18 and 58 and with each layer 76 surrounded by a high-K dielectric material layer 77.

In the embodiment of FIG. 3, FET 50 is a heater FET, and first drain metal contact via structure 35 is a drain contact (Dh) for connection to a "heating" device for sourcing/sinking electric current driven of device 50 and first source metal contact via structure 38 functions as a source contact (Sh) for connection the heating device for sinking/sourcing current driven of device 50 and thereby cause a heating of the device 50 when power is applied. However, in the embodiment of FIG. 3, a second drain contact via structure 75 (EV1) is formed on a top surface of the further vertically aligned drain contact electrode 65 outside the heater FET 50 and a second source contact via structure 79 (EV2) is formed on a top surface of the vertically aligned source contact electrode 68 outside the heater FET 50. Standard semiconductor manufacturing techniques could be used for Kelvin sensor building (e.g., etching+metal film deposition+Chemical-Mechanical Planarizing,) and contact via formation.

In this embodiment, the further drain contact via structures 75 (EV1) and source contact via structure 79 (EV2) function as respective "Kelvin" sensor contacts for connection to a measurement device or circuit, e.g., part of a Kelvin sensor (not shown), for measuring an electrical characteristic, voltage or resistance across the gate 30, i.e., across the nanosheet channels 16 between drain region 15 and source region 18. By placement of the Kelvin sensor at each of the drain and source contact vias 75, 79 outside the heater FET 50, a resistance value of the gate and channels may be measured, e.g., by measuring the change in voltage between EV1 and EV2 Kelvin sensor connections concurrent with the heater being powered "off" or powered "on" at various power levels, i.e., with or without application of the stimulus driving Dh and Sh terminals of the heater FET 50.

That is, in the embodiment of FIG. 3, the placement of the Kelvin sensor via connection EV1 75 still enables a voltage measurement at first drain contact 25, as the voltage V2 (=voltage at EV1) at drain contact electrode 65 is equal to voltage V1 at drain contact electrode 25 due to the vertically stacked semiconductor nanosheet channel layers 66 that are suspended between and functionally connect drain regions 15 and 55. Similarly, the placement of the Kelvin sensor via connection EV2 79 still enables a voltage measurement at first source contact 28, as the voltage V4 (=voltage at EV2) at source contact electrode 68 is equal to the voltage V3 at source contact electrode 28 due to the vertically stacked semiconductor nanosheet channel layers 76 that functionally interconnect source regions 18 and 58. For example, providing a stimulus at Sh contact via of 0 volts (or ground) and a stimulus at Dh contact via of 1 V, and by taking a direct voltage measurement between Kelvin sensor terminal EV1 at additional drain contact 65 and at Kelvin sensor terminal EV2 at additional source contact 68, then a total resistance "R" across the channel of FET device 50 is computed as:

$$R=(V3-V1)/\text{current},$$

which excludes any contact resistance measurement or voltage drops at interfaces of contact and epitaxially grown structures (e.g., contact structure 25 to epi structure 15 and contact structure 28 to epi structure 18), the via contact or voltage drop due to any metal conductor, e.g., any M1 metal level conductor that may be connected to the drain contacts 25, 65 or source contacts 28, 68. In such an embodiment, a power "P" consumed due to self-heating effects at device 50 can be computed according to $$P=\Delta V*I$$

where ΔV is the V3−V1 measurement and I is the electrical current measured through device structures between the drain and source contacts 65, 68 at EV1 and EV2 via connections. Given the example stimulus of 1 Volt at Dh and 0 Volts at Sh, the ΔV<1.

Figure 4:
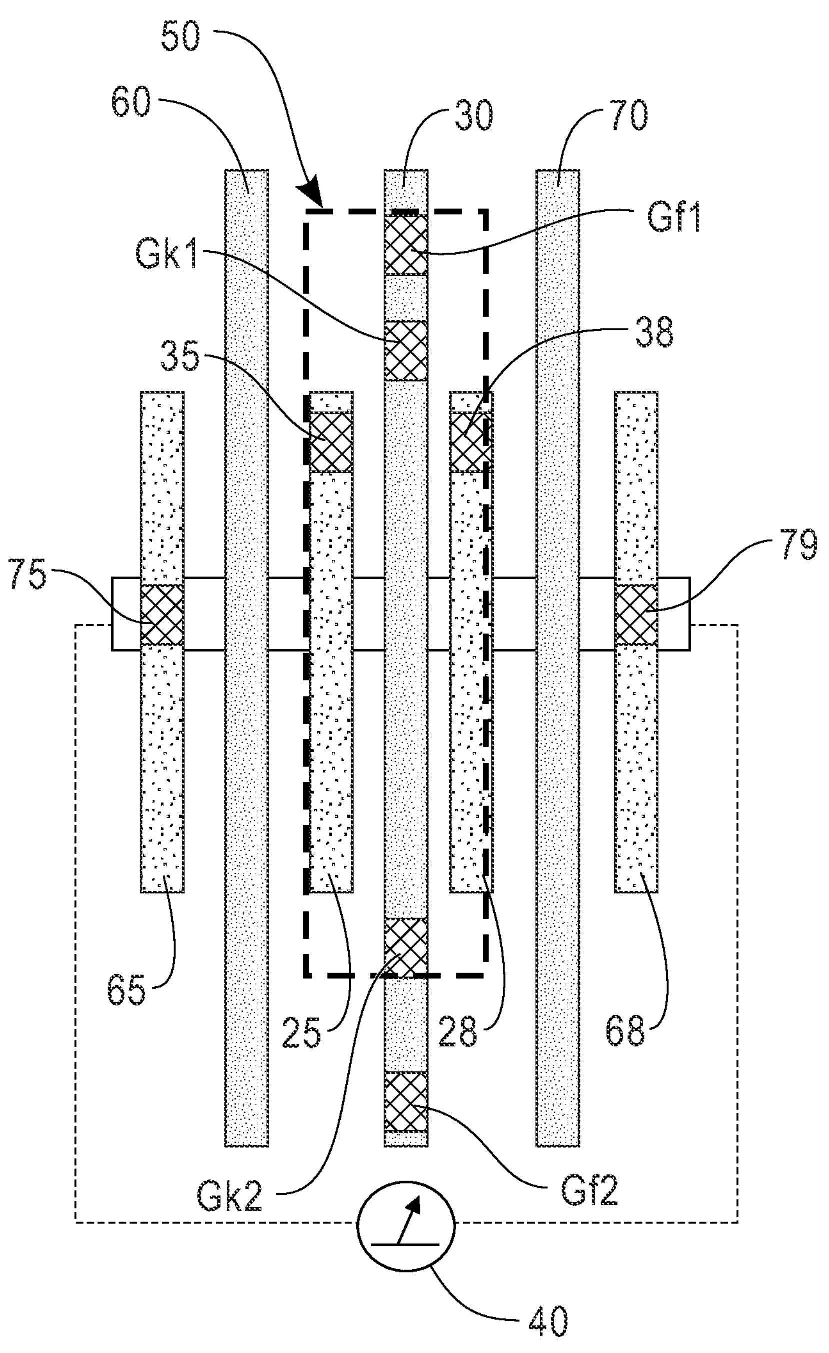
FIG. 4 shows a top view of a surface of the nanosheet FINFET heater device of the embodiment of the present disclosure shown in FIG. 3.

FIG. 4 shows a top view of a surface of the device 50 of the embodiment shown in FIG. 3. Illustrated in FIG. 4 is the FET device layout including gate contact 30 and further adjacent dummy gate structures 60, 70, drain contact electrodes 25, 65 and source contact electrodes 28, 68, the location of respective heater device drain Dh and source Sh contacts formed on respective drain and source contacts 25, 28 of the heater FET 50 for connection to a power source for driving the device 50, and the location of the Kelvin sensor device drain EV1 and source EV2 contacts formed on respective further drain and source contacts 65, 68 outside the heater FET 50 for connection to a sensor 40 for measuring a device characteristic, e.g., voltage, current or resistance, between the drain and source terminals or across the NS channels 16. FIG. 4 additionally depicts a traditional four terminal connection Kelvin sensor measurement configuration at the metal gate structure 30 having Gf1, Gf2 and GK1 and GK terminal connections for direct connection to a four-terminal Kelvin sensor apparatus, with Gf1, Gf2 terminal connections connecting to a gate "force" or "heater" device (not shown) for driving a current stimulus at the gate 30 and by directly measuring voltage, at GK1 and GK2 sensor terminal by turning heater device 50 on and off.

Figure 5:
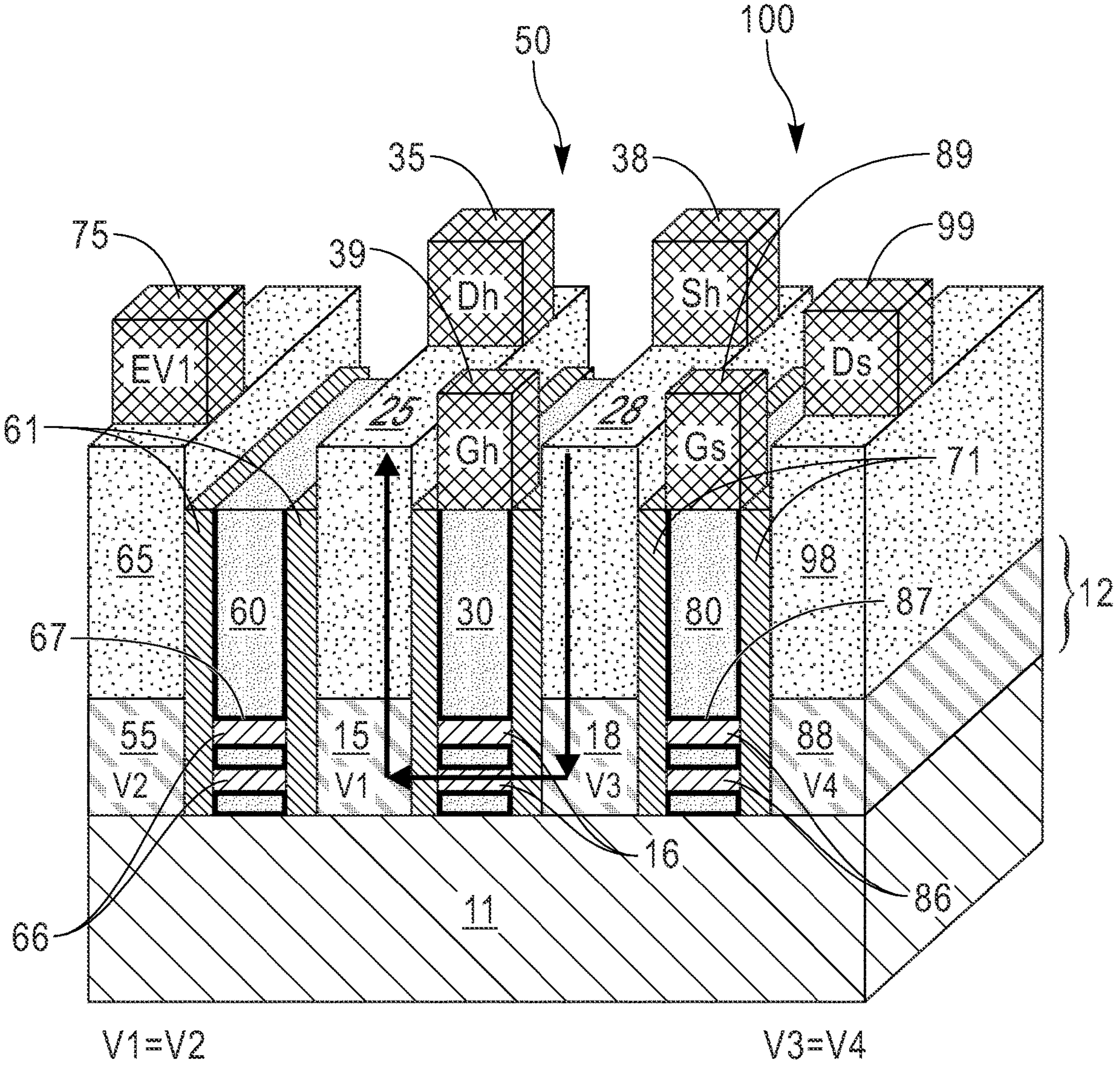
FIG. 5 shows a cross section view of a portion of a further “heater” semiconductor NS FinFET device such as shown in FIG. 3, and a connected adjacent sensor semiconductor FinFET device in further embodiment.
Figure 6:
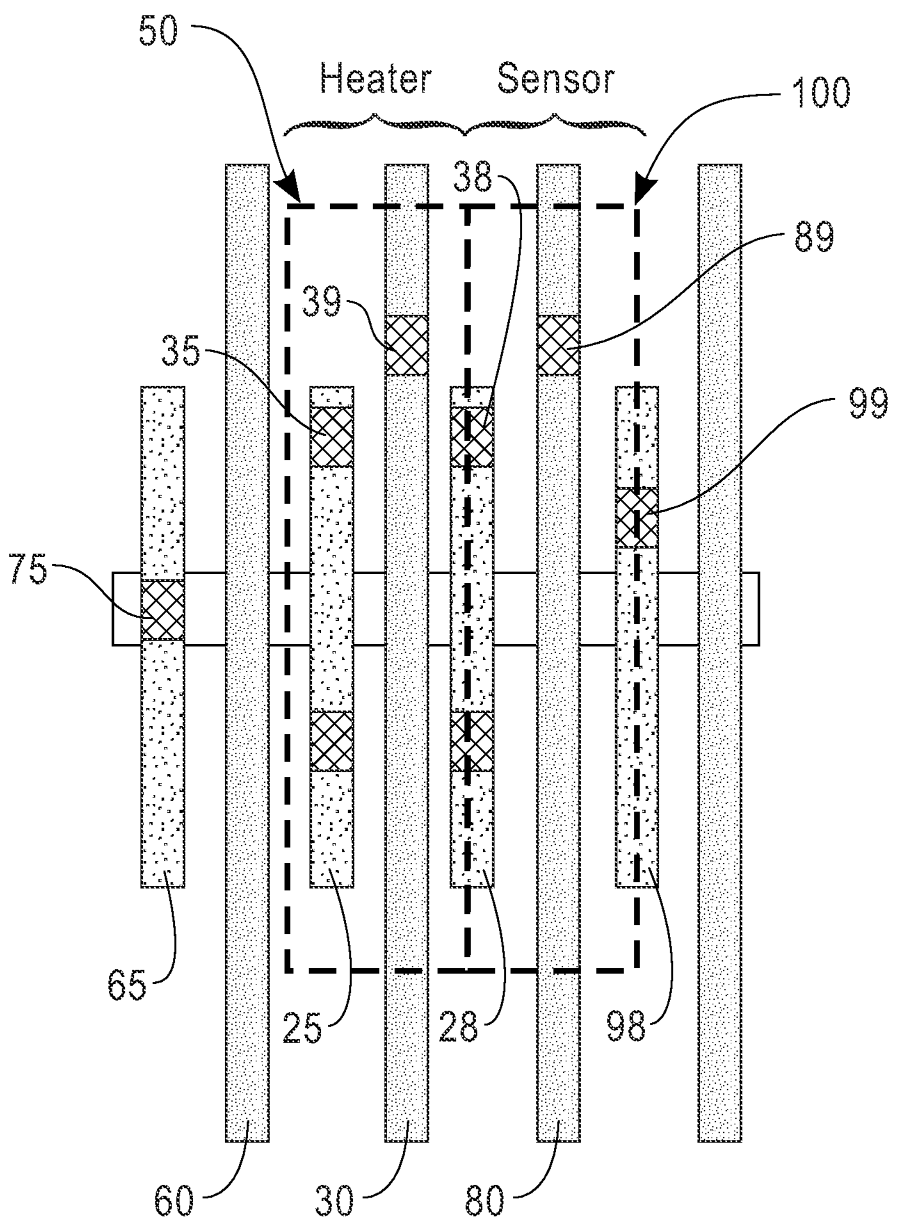
FIG. 6 shows a corresponding top view of a surface of the heater FET device and adjacent sensor FET device of the embodiment shown in FIG. 5.

In accordance with the third embodiment, FIG. 5 shows a cross section view of a portion of a further "heater" semiconductor NS FinFET device, e.g., a nanosheet FinFET 50 such as shown in FIG. 3, and an adjacent sensor semiconductor FinFET device, e.g., FinFET 100. FIG. 6 shows a corresponding top view of a surface of the heater FET device 50 and adjacent sensor FET device 100 of the embodiment shown in FIG. 5.

The "heater" semiconductor NS FinFET device 50 includes, as shown vertically from bottom up, a semiconductor substrate 11, and an epitaxially grown semiconductor material layer 12 formed on substrate 11 that includes the heater device drain region 15 and heater device source region 18 and their respective vertically aligned metal contact structures 25, 28, the embedded spacers 20L, 20R and gate structure 30 formed therebetween and the one or more embedded horizontal vertically stacked semiconductor nanosheet channel layers 16 as in the embodiment of FIGS. 1, 3. The gate contact 30 of the heater FET 50 includes a metal contact via structure 39 (Gh) formed atop the gate contact 30. The embodiment of heater device 50 of FIG. 5 further includes an adjacent structure including additional region 55 and respective vertically aligned contact electrode 65 separated from the heater device drain region/contact 15/25 by a further dummy gate structure 60 sandwiched between two spacer structures 61 and further includes embedded one or more epitaxially grown horizontal vertically stacked semiconductor nanosheet channel layers 66 that are suspended between and connect drain regions 15 and 55 and each layer 66 surrounded by a high-K dielectric material layer 67.

The embodiment of device 50 of FIG. 5 further includes an adjacent "sensor" FET structure 100 that includes a source region/aligned contact 18/28 that is common to the source region/terminal of the heater FET 50, a region 88 and corresponding vertically aligned contact electrode 98 separated from the device's common source region/contact 18/28 by a further metal gate structure 80 sandwiched between two spacer structures 71 however including further embedded one or more horizontal vertically stacked semiconductor nanosheet channel layers 86 that are suspended between and functionally connect source regions 18 and drain region 88 of the sensor FET 100 and each layer 86 surrounded by a high-K dielectric material layer 87. Formed atop further metal gate structure 80 is a metal gate contact via structure (Gs) 89 which is connected to a stimulus for obtaining sensor readings at the FET sensor device 100. Thus, it is the case that Ds contact has two functions: 1) used as drain contact at adjacent sensor device; and 2) used as EV2 to sense voltage drop to extract contact resistance.

In the embodiment of FIG. 5, FET 50 is a heater FET, and first drain metal contact via structure 35 is a drain contact (Dh) of a "heating" device (not shown) for sourcing/sinking electric current driven and first source metal contact via structure 38 functions as a source contact (Sh) of the heating device for sinking/sourcing current driven and thereby cause a heating of the device 50 when power is applied. However, in the embodiment of FIG. 5, a second contact via structure 75 is formed on a top surface of the further vertically aligned adjacent contact electrode 65 outside the heater FET 50 and, at the sensor FET 100, a contact via structure 99 is formed on a top surface of the vertically aligned contact electrode 98 of the adjacent sensor FET 100. In this embodiment, the further contact via structure 75 (EV1) adjacent the heater FET device 50 and the contact via structure 99 (Ds) of the adjacent sensor FET 100 function as respective "Kelvin" sensor contacts for heater device or circuit which is part of the Kelvin sensor measurement loop for measuring an electrical characteristic, e.g., current or voltage or resistance across gate 30, and in particular, across the nanosheet channels 16 between drain region 15 and source region 18.

For example, by placement of the Kelvin sensor at the further contact via 75 (EV1) outside the heater FET 50, and placement of the Kelvin sensor at a contact via structure 99 (Ds) of the sensor FET 100, a resistance value of the channels may be measured by measuring the change in voltage between EV1 and Ds of Kelvin sensor connections concurrent with or without application of the stimulus driving Dh and Sh terminals of the heater FET 50.

In another embodiment of FIG. 5, once heater device 50 is on, Sk/Dk (FIG. 1) or EV1/Ds contact vias could be used to make accurate power consumption of heater while electrical characterization could be performed on sensor device to evaluate electrical parameters change as Vth (threshold voltage) or Ss (sub-threshold slope) etc. while heater is on and off.

Figure 7:
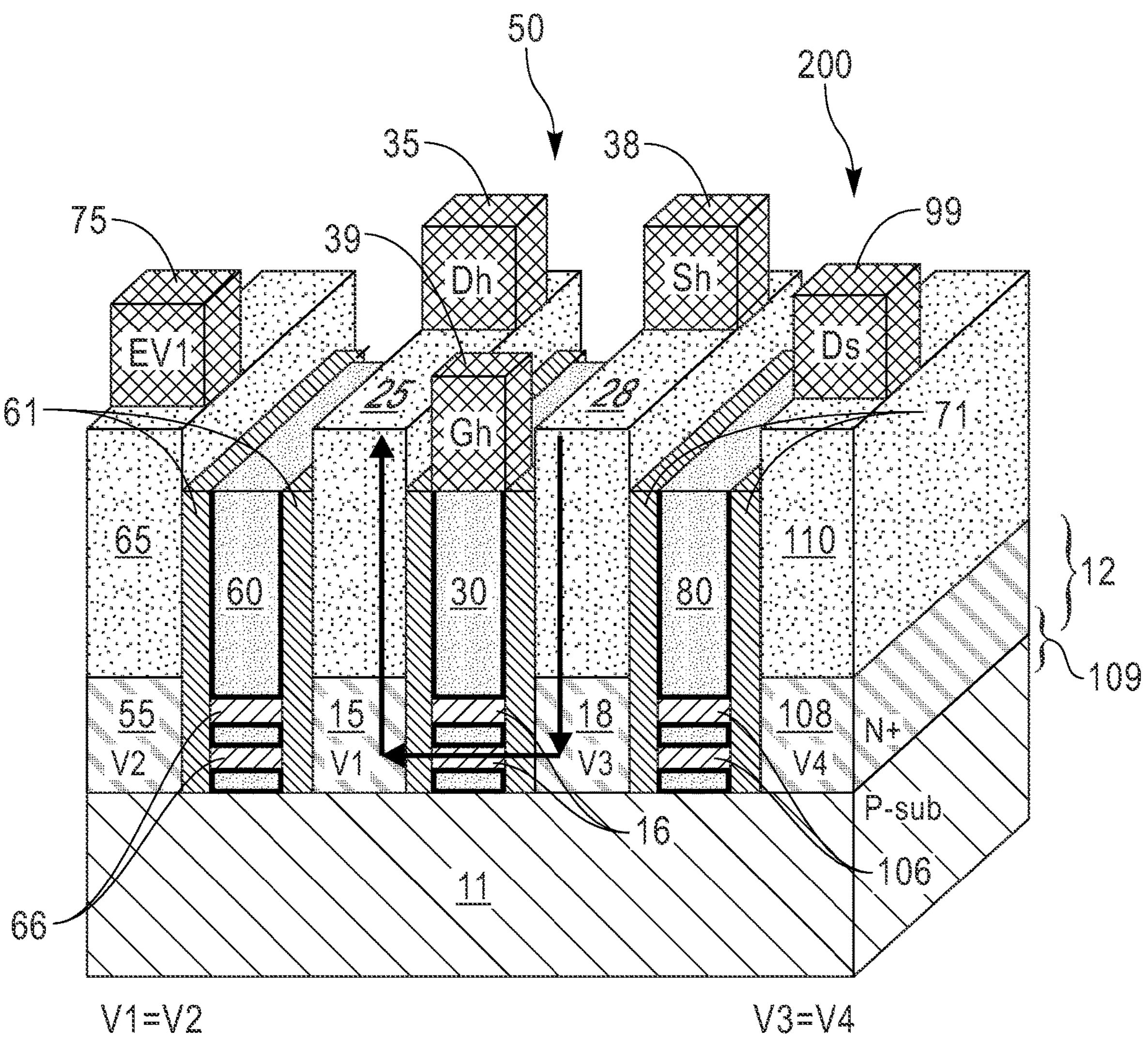
FIG. 7 shows a cross section view of a portion of a further "heater" semiconductor NS FinFET device, e.g., a nanosheet FinFET such as shown in FIG. 5, and a connected adjacent sensor semiconductor device that includes a semiconductor junction structure.
Figure 8:
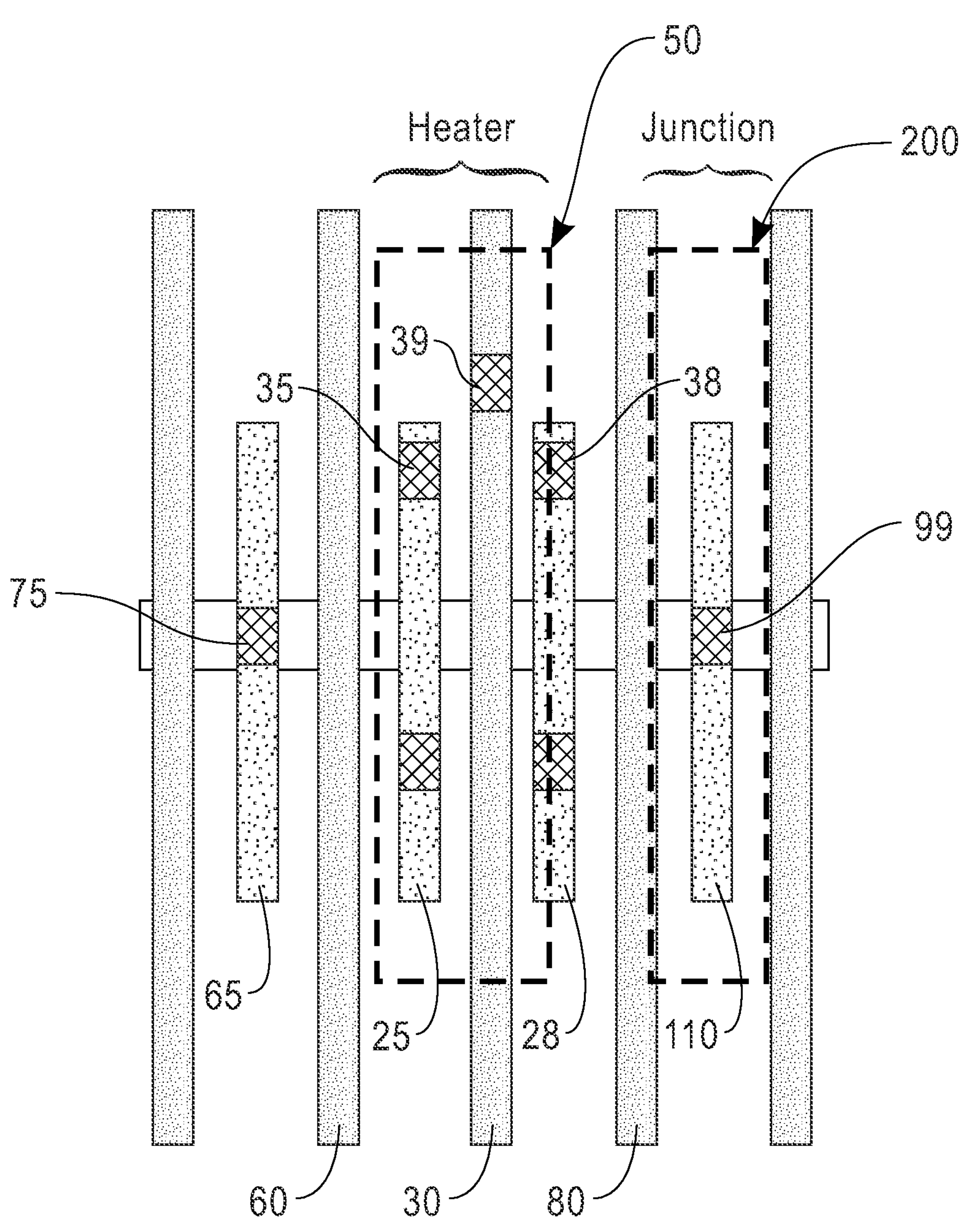
FIG. 8 shows a corresponding top view of a surface of the heater NS FinFET heater device and adjacent sensor junction device of the embodiment shown in FIG. 7.

In accordance with the fourth embodiment, FIG. 7 shows a cross section view of a portion of a further "heater" semiconductor NS FinFET device, e.g., a nanosheet FinFET 50 such as shown in FIG. 5, and an adjacent sensor semiconductor device 200 that includes a semiconductor junction structure 109 of two adjacent oppositely doped regions, e.g., a diode or like PN doped semiconductor material junction. FIG. 8 shows a corresponding top view of a surface of the heater NS FinFET heater device 50 and adjacent sensor junction device 200 of the embodiment shown in FIG. 7.

In the embodiment depicted in FIG. 7, the "heater" semiconductor NS FinFET device 50 includes, as shown vertically from bottom up, a semiconductor substrate 11, an epitaxially grown semiconductor material layer 12 formed on substrate 11 that includes the heater device drain region 15 and heater device source region 18 and their respective vertically aligned metal contact structures 25, 28, the embedded spacers 20L, 20R and heater device gate structure 30 formed therebetween and the one or more embedded horizontal vertically stacked semiconductor nanosheet channel layers 16 suspended between the drain region 15 and source region 18 for electrical connection therebetween as in the embodiment of FIGS. 1, 3 and 5. The gate contact 30 of the heater FET 50 includes a metal contact via structure 39 (Gh) formed atop the gate contact which can receive a stimulus to cause a self-heating effect. The embodiment of heater device of FIG. 7 further includes an adjacent structure including additional region 55 and respective vertically aligned contact electrode 65 separated from the heater device drain region/contact by a further dummy gate structure 60 sandwiched between two spacer structures 61 and further includes embedded one or more epitaxially grown horizontal vertically stacked semiconductor nanosheet channel layers 66 that are suspended between and connect drain regions 15 and 55 and each layer 66 physically surrounded by a formed high-K dielectric material layer (not shown).

The embodiment of device 50 of FIG. 7 further includes an adjacent sensor device 200 including the source region/aligned contact 18/28 that is common to the source region/terminal of the heater FET 50, and a further epitaxially grown drain region 108 and corresponding vertically aligned drain contact electrode 110 separated from the device's common source region/contact 18/28 by the further metal gate structure 80 sandwiched between two spacer structures 71. This device structure 200 further includes vertical junction 109, i.e., given a substrate as including P-type dopant material, the epitaxially grown drain region 108 can be formed to include N+ type dopant materials thus forming a PN junction 109 which can be used as the sensor device used for determining self-heating effects of heater device 50.

In the embodiment of FIG. 7, formed atop the further vertically aligned contact structure 65 is a metal via structures 75 (EV1) and formed atop vertically aligned contact electrode 110 connecting region 108 of PN junction sensor 109 is a metal drain contact via structure (Ds) 99. These contact via structures 75 (EV1) and Ds 99 function as respective "Kelvin" sensor contacts for connection to a measurement device or circuit, which is part of the Kelvin sensor measurement loop for measuring an electrical characteristic, e.g., current or voltage or resistance across gate 30, i.e., across the nanosheet channels between drain and source regions that measures the electrical characteristic, e.g., current or voltage or resistance across the gate 30, i.e., across the nanosheet channels 16 between drain region 15 and source region 18.

By placement of the Kelvin sensor measurement device connection at the via contact EV1 75 outside the heater FET 50 and a further sensor measurement device connection at a via contact Ds 99 of the junction sensor 200, a resistance value of the channels may be measured by measuring the change in voltage between EV1 and Ds of the Kelvin sensor connections concurrent either with or without application of the stimulus driving Dh and Sh terminals of the heater FET 50. Any device characteristic measurement performed excludes a power consumption at the via and at any metal conductor, e.g., a M1 metal level conductor, that may connect to a FET metal contact.

Figure 9:
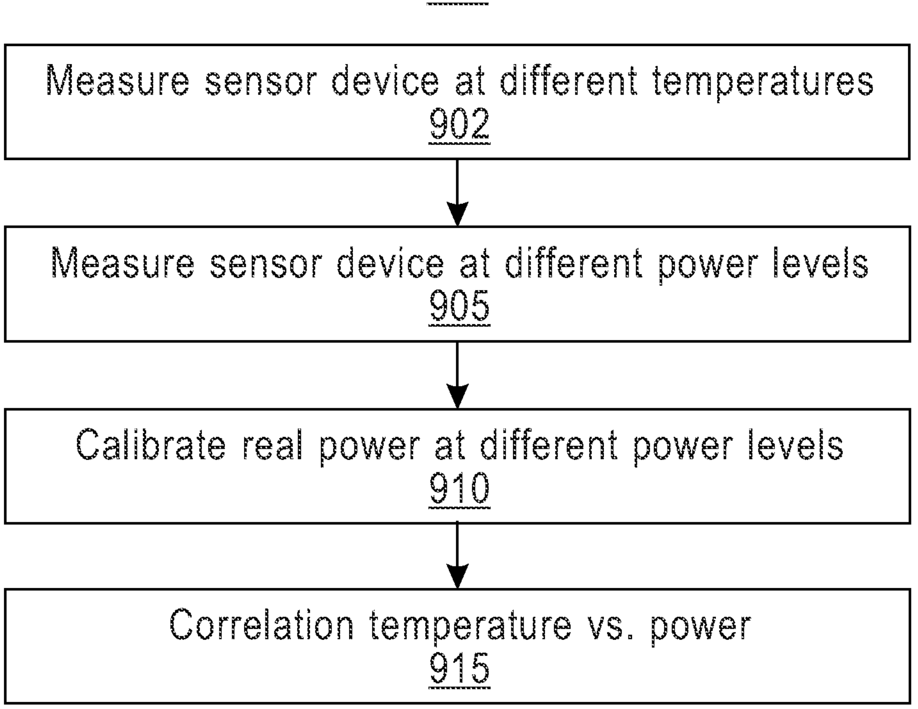
FIG. 9 depicts an overall flow methodology for determining the self-heating effects of devices such as the heater FET (e.g., a planar MOSFET, a FinFET, a NS FinFET) using a four terminal (Kelvin) sensing method in the manner depicted in each of the embodiments.

FIG. 9 depicts an overall flow methodology 900 for determining the self-heating effects of devices such as the heater FET (e.g., a planar MOSFET, a FinFET, a NS FinFET) using a four terminal (Kelvin) sensing method in the manner depicted in each of the embodiments.

At a first step 902, the method obtains a measurement of the sensor device at a different temperature. At this step, the measurement include a measurement of the gate resistance (Rgate) without the effect of heating the device. That is, the gate resistance (Rgate) can be measured at different ambient temperatures, e.g., ambient temperatures ranging between −100° C. to 300° C. without the heater FET on. At the range of ambient temperatures, additional device measurements can be taken at the adjacent FET sensor devices without the heater FET on, such as a measurement take at adjacent FET sensor 100 (FIG. 5) or at junction 200 (FIG. 5 or 7). For example, a device parameter (an electrical current or voltage) can be measured flowing through the adjacent FET or through the adjacent junction device 200 with the heater FET device 50 placed in an "off" state.

Continuing to 905, FIG. 9, the method continues to obtain a measurement of the sensor device at a different temperature, however at this step, the measurement include a measurement of the gate resistance (Rgate) with the effect of heating the device. That is, the gate resistance (Rgate) can be measured at different ambient temperatures, e.g., ambient temperatures ranging between −100° C. to 300° C. with the heater FET on. At the range of ambient temperatures and with the heater device on to produce self-heating effects, the additional device measurements are taken at the adjacent FET sensor 100 (FIG. 5) or at junction 200 (FIG. 7). For example, a device parameter (an electrical current or voltage) can be measured flowing through the adjacent FET or through the adjacent junction device 200 with the heater FET device 50 placed in an "on" state.

Such electrical device parameter can include a Vt (transistor threshold voltage) at the adjacent sensor FET device, or a current measurement through the semiconductor junction structure. In an embodiment, the heater FET device can be placed at a different on state depending upon the voltages applied to the gate, source and drain contacts of the heater FET 50 while the electrical device parameter is being measured.

Then, continuing to 910, there is performed additional steps of calibrating the real power consumed at the heater at different power levels and taking into account the different ambient temperatures (obtained at step 902). The calibration of real power generated by self-heating of the heater FET entails computing a power based upon the voltage changes and a corresponding measured current using the Kelvin sensor in various "on" states (power levels).

Continuing, at 915, there is performed a step of correlating a temperature value versus the real electrical parameter computed at the prior step 910. For example, in an embodiment, a formula that correlates a sensor device parameter vs. power measurement at a temperature value can be invoked to characterize the effect of the heater transistor device while in various “on” states (power levels).

Figure 10:
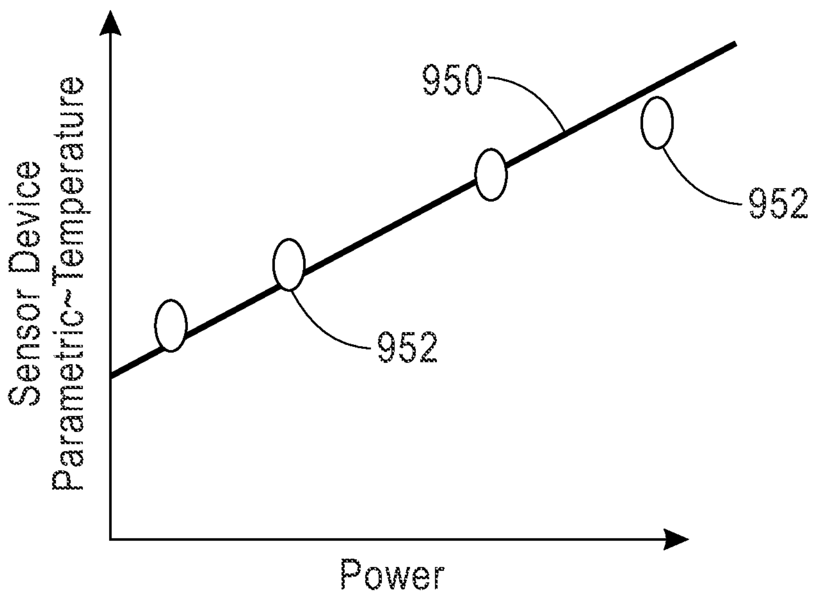
FIG. 10 shows a resulting plot depicting determined extracted self-heating temperature values (Y-axis) as a function of the power levels (X-axis) of the heater obtained based upon the measurements using the heater device while in various "on" states

FIG. 10 shows a resulting plot 950 depicting determined extracted self-heating temperature values (Y-axis) as a function of the power levels (X-axis) of the heater obtained based upon the measurements using the heater device while in various “on” states. For example, individual electrical characteristic measurement values 952 (e.g., resistance) obtained at the gate of the heater device (e.g., as measured by resistance across the device channel between the drain and source regions) can be plotted as a function of the heater device at various “on” states, i.e., as a function of different applied power levels. More generally, obtained sensor device parametrics can be plotted on Y-axis as a function of applied heater device power levels.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor device comprising:

a first semiconductor transistor heater device having a drain region, a source region, the drain region and source region defining a device channel therebetween, and a gate region, the drain, source and gate regions configured to receive an electrical stimulus to place said first semiconductor transistor heater device in an on or off state;

a second semiconductor transistor device situated adjacent and electrically connected to the first semiconductor transistor heater device, wherein the first semiconductor transistor heater device is a first FET device and said second semiconductor transistor device is a second FET device, said drain region of said first semiconductor transistor device comprising:

a first drain region having a first drain contact via structure formed thereon, and a second drain region, said first drain region and second drain region of said first semiconductor transistor device being separated by a dummy gate therebetween, and said first drain region and second drain region being electrically connected by first embedded one or more semiconductor nanosheet channel layers that are each surrounded by a dielectric material layer and suspended through said dummy gate and electrically connect the first drain region to the second drain region; and said source region of the first semiconductor transistor heater device comprising a source region common to both said first FET and second FET devices, said source region having a second contact via structure formed thereon, the second semiconductor transistor device further comprising:

a further drain region having a third contact via structure formed thereon, the further drain region separated from said common source region and second contact via structure, said further drain region and common source region of said adjacent second semiconductor transistor device being separated by a further gate region therebetween, and said further drain region and common source region being electrically connected by second embedded one or more semiconductor nanosheet channel layers that are each surrounded by a dielectric material layer and suspended through said further gate region and electrically connect the further drain region to the common source region;

a fourth contact via structure formed atop the second drain region; and a sensor operatively connected to said first semiconductor transistor heater device for measuring an electrical characteristic at said second semiconductor transistor device, wherein said sensor is a four-terminal Kelvin sensor structure operatively connected to said first semiconductor transistor heater device, said Kelvin sensor structure having first and second Kelvin terminals operable to connect to said first contact via and second contact via structures to apply voltage between said first drain region and said common source region, and having third and fourth kelvin terminals operable to connect to said third contact via and fourth contact via structures to measure the electrical characteristic between said second drain contact structure formed atop the second drain region and the further drain contact structure formed atop the further drain region, wherein the Kelvin sensor structure obtains an electrical characteristic measurement of the defined device channel of said first semiconductor transistor heater device while said first semiconductor transistor heater device is in an off or on state and that excludes a metal/contact resistance drop.

2. The semiconductor device as claimed in claim 1, wherein the drain region of said first semiconductor transistor heater device comprises a drain contact structure formed atop the drain region and the source region of said first semiconductor transistor heater device comprises a source contact structure formed atop the source region, and wherein the drain contact of said first semiconductor transistor heater device comprising a first contact via structure; and the source contact of the first semiconductor transistor heater device comprising a second contact via structure, said first and second contact via structures for connecting to a respective first and second Kelvin terminal configured to apply an electrical stimulus to said first semiconductor transistor heater device; and said drain contact of said first semiconductor transistor heater device further comprising a third contact via structure spaced apart from said first contact via structure, and said source contact of said first semiconductor transistor heater device further comprising a fourth contact via structure spaced apart from said second contact via structure, said third and fourth contact vias for connecting to a respective third and fourth Kelvin terminal configured for measuring an electrical parameter of said Kelvin sensor.

3. The semiconductor device as claimed in claim 2, wherein said electrical stimulus is a first voltage differential applied across a channel connecting the drain region and said source region of said first semiconductor transistor heater device, and said measured electrical characteristic comprises a second voltage differential, said second voltage differential used to determine a power consumption of the first semiconductor transistor heater device while said first transistor device is in an on or off state, wherein said power consumption determination excludes a power consumption due to voltage drops at said contact via structures and avoids a power consumption at any metal conductor connecting to contact via structures.

4. The semiconductor device as claimed in claim 3, wherein the first semiconductor transistor heater device is a nanosheet FinFET transistor comprising one or more nanosheet channel structures connected between said drain region and said source region and extending though said gate structure.

5. The semiconductor device as claimed in claim 1, wherein the drain region of said first semiconductor transistor heater device comprises:

a first drain region having a first drain contact structure formed on top the first drain region; and a second drain region having a second drain contact structure formed on top the second drain region; and a first dummy gate structure separating said first drain and second drain regions and drain contact structures; and the source region of said first semiconductor transistor device comprises:

a first source region having a first source contact structure formed on top the first source region; and a second source region having a second source contact structure formed on top the second source region; and a second dummy gate structure separating said first source and second source regions and source contact structures.

6. The semiconductor device as claimed in claim 5, wherein the first drain contact structure of said first semiconductor transistor heater device comprises a first drain contact via structure; and the first source contact structure of said first semiconductor transistor heater device comprises a second contact via structure, said first and second contact via structures for connecting to a Kelvin sensor configured to apply an electrical stimulus; and the second drain contact structure of said first semiconductor transistor heater device comprises a third contact via structure, and the second source contact structure of said first semiconductor transistor heater device comprises a fourth contact via structure, said third and fourth contact via structures for connecting to a measuring device also function as Kelvin sensor for measuring an electrical characteristic of said first semiconductor transistor heater device or second semiconductor transistor device.

7. The semiconductor device as claimed in claim 6, wherein said measured electrical characteristic comprising one or more of a voltage, current or resistance measurement for determining a power consumption component of the first semiconductor transistor heater device while said first semiconductor transistor heater device is in an off or on state, wherein said power consumption avoids a power consumption component due to a voltage drop at a said contact via structure and avoids a power consumption component due to any metal conductor connecting to a contact via structure.

8. The semiconductor device as claimed in claim 6, wherein the applied electrical stimulus is a first voltage differential and said measured electrical characteristic comprises:

a second voltage difference across a channel structure connecting the first drain region and the first source region.

9. The semiconductor device as claimed in claim 8, wherein the first semiconductor transistor heater device is a nanosheet FinFET transistor, said channel structure comprising one or more nanosheet channel structures directly connecting said first drain region and second drain and extending though said gate structure; and said first semiconductor transistor heater device further comprises:

one or more nanosheet channel structures connected between said first drain region and second drain region and extending said kelvin sensor wherein a voltage at said first drain region and second drain region are equal; and one or more nanosheet channel structures connected between said first source region and second source region and extending said kelvin sensor wherein a voltage at said first source region and second source region are equal.

10. The semiconductor device as claimed in claim 1, wherein said gate structure of said first semiconductor transistor heater device comprises:

a gate contact via structure formed on top said gate structure, wherein a stimulus applied to one or more said first and second contact via structures and said gate contact via structure operably place said first semiconductor transistor heater device in said on or off state, said measured electrical characteristic used to determine a power consumption component of the first semiconductor transistor heater device while said first semiconductor transistor heater device is in the on or off state.

11. The semiconductor device as claimed in claim 10, wherein said electrical stimulus is a first voltage differential, said Kelvin sensor configured to measure an electrical characteristic comprising a second voltage difference between said third and fourth contact via structures while said first semiconductor transistor heater device in an off or on state, said second voltage difference used to determine a power consumption of said first semiconductor transistor heater device.

12. The semiconductor device as claimed in claim 11, wherein the measured electrical characteristic at said first semiconductor transistor heater device excludes a voltage drop due to a contact resistance at each said contact via structures and avoids a voltage drop component due to any metal conductor connecting to a contact via structure.

13. The semiconductor device as claimed in claim 10, wherein the further drain region of said second semiconductor transistor device is doped with a first type doping material, and a further semiconductor region abutting said further drain region is doped with a second opposite type doping material to form a semiconductor junction device comprising oppositely doped regions.

14. A computer-implemented method for determining a semiconductor transistor device characteristic comprising:

operatively connecting a sensor device to a first semiconductor transistor heater device and a second semiconductor transistor device situated adjacent said first semiconductor transistor heater device, said first semiconductor transistor heater device having a drain region, a source region, the drain region and source region defining a device channel therebetween, the drain, source and gate regions configured to receive an electrical stimulus to place said first semiconductor transistor heater device in an on or off state; and the second semiconductor transistor device situated adjacent and electrically connected to the first semiconductor transistor heater device, wherein the first semiconductor transistor heater device is a first FET device and said second semiconductor transistor device is a second FET device, said drain region of said first semiconductor transistor device comprising:

a first drain region having a first drain contact via structure formed thereon, and a second drain region, said first drain region and second drain region of said first semiconductor transistor device being separated by a dummy gate therebetween, and said first drain region and second drain region being electrically connected by first embedded one or more semiconductor nanosheet channel layers that are each surrounded by a dielectric material layer and suspended through said dummy gate and electrically connect the first drain region to the second drain region; and said source region of the first semiconductor transistor heater device comprising a source region common to both said first and second FET devices, said source region having a second contact via structure formed atop the common source region, the second semiconductor transistor device further comprising:

a further drain region having a third contact via structure formed thereon, the further drain region separated from said common source region and corresponding second contact via structure, said further drain region and common source region of said adjacent second semiconductor transistor device being separated by a further gate region therebetween, and said further drain region and common source region being electrically connected by second embedded one or more semiconductor nanosheet channel layers that are each surrounded by a dielectric material layer and suspended through said further gate region and electrically connect the further drain region to the common source region;

said second drain region having a fourth contact via structure formed atop the second drain region; and wherein said sensor device is a four-terminal Kelvin sensor structure operatively connected to said first semiconductor transistor heater device, said Kelvin sensor structure having first and second Kelvin terminals operable to connect to said first contact via and second contact via structures and applying voltage between said first drain region and said common source region for placing said first semiconductor transistor heater device in an on or off state, and having third and fourth kelvin terminals operable to connect to said third contact via and fourth contact via structures to measure the electrical characteristic between said second drain contact structure formed atop the second drain region and the further drain contact structure formed atop the further drain region;

configuring the sensor device to apply an electrical stimulus to one or more said drain contact, source contact or gate region for placing said first semiconductor transistor heater device in an on or off state; and measuring an electrical characteristic of said defined device channel of said first semiconductor transistor heater device while said first semiconductor transistor heater device is in said on or off state, said electrical characteristic used to correlate temperature to a corrected power consumption impact from first semiconductor transistor heater device, wherein the Kelvin sensor structure obtains an electrical characteristic measurement that excludes a metal/contact resistance drop.

15. The computer-implemented method of claim 14, wherein the configuring the sensor device to apply an electrical stimulus comprises:

altering the electrical stimulus applied to said drain, source and gate contact structures of said first semiconductor transistor heater device, said altering electrical stimulus achieving a different power level at said first semiconductor transistor heater device; and measuring an electrical characteristic of said second semiconductor device while said first semiconductor transistor heater device is in said on or off state.

16. The computer-implemented method of claim 15, further comprising:

calibrating a real power consumed at said first semiconductor transistor heater device at each said different power level applied at said first semiconductor transistor heater device.

17. The computer-implemented method of claim 16, further comprising:

correlating a temperature of said first semiconductor transistor heater device at each said different power level applied at said first semiconductor transistor heater device.

* * * * *